United States Patent [19]
Fukaya

[11] Patent Number: 6,037,045
[45] Date of Patent: Mar. 14, 2000

[54] THICK-FILM PASTE AND CERAMIC CIRCUIT SUBSTRATE USING THE SAME

[75] Inventor: Masashi Fukaya, Kuwana, Japan

[73] Assignee: Sumitomo Metal (SMI) Electronics Devices, Inc., Mine, Japan

[21] Appl. No.: 08/980,179

[22] Filed: Nov. 26, 1997

Related U.S. Application Data

[63] Continuation-in-part of application No. 08/604,600, Feb. 21, 1996, abandoned.

[51] Int. Cl.[7] ....................................................... B32B 9/00
[52] U.S. Cl. .......................... 428/210; 428/432; 428/697; 428/699; 174/257; 174/258
[58] Field of Search ..................................... 428/209, 210, 428/697, 432, 699; 174/257, 258

[56] References Cited

U.S. PATENT DOCUMENTS

| | | | |
|---|---|---|---|
| 5,004,640 | 4/1991 | Nakatani et al. | 428/209 |
| 5,264,272 | 11/1993 | Tanabe et al. | 428/209 |
| 5,514,451 | 5/1996 | Kumar et al. | 428/210 |
| 5,562,973 | 10/1996 | Nagasaka et al. | 428/210 |

*Primary Examiner*—Deborah Jones
*Assistant Examiner*—Cathy F. Lam
*Attorney, Agent, or Firm*—Flynn, Thiel, Boutell & Tanis, P.C.

[57] ABSTRACT

A ceramic circuit element comprising a ceramic substrate having co-fired resistor and glass overcoat thereon in which the resistor is formed from a resistor paste consisting essentially of $RuO_2$ powder, glass powder and a vehicle comprising an organic polymer and a solvent, the $RuO_2$ powder and the glass powder having specific surface areas of 10 to 20 $m^2/g$ and 4 to 14 $m^2/g$, respectively; the glass overcoat is formed from a glass overcoat paste consisting essentially of a glass composition and a vehicle comprising an organic polymer and a solvent, the glass composition having a specific surface area of 2 to 6 $m^2/g$; and the ceramic circuit substrate comprises a $CaO$—$Al_2O_3$—$SiO_2$—$B_2O_3$ system or $MgO$—$Al_2O_3$—$SiO_2$—$B_2O_3$ system glass and alumina. The use of the foregoing resistor and glass overcoat pastes minimizes the bubbles remaining in the resistor and realizes the exertion of resistance performance ensuring excellent weather resistance and stability, even after the resistor is subjected to trimming.

9 Claims, 1 Drawing Sheet

THICK-FILM PASTE AND CERAMIC CIRCUIT SUBSTRATE USING THE SAME

This is a continuation in part of U.S. application 08/604,600 filed Feb. 21, 1996, which has been abandoned.

BACKGROUND OF THE INVENTION

1. Field of the Invention

The present invention relates to a thick-film paste used in the preparation of a ceramic circuit substrate having on its surface an external resistor covered with a glass overcoat and to a ceramic circuit substrate in which the paste is used. More particularly, the present invention is concerned with a ceramic circuit substrate having an external resistor which stably maintains an accurate resistance value obtained by trimming.

2. Description of Prior Art

Besides the internal resistor disposed between the layers of a multilayer circuit substrate, a ceramic circuit substrate for use in integral circuits is provided with a circuit comprising a conductor pattern and an external resistor printed on the surface of the ceramic circuit substrate, which contributes toward imparting an advanced function to the ceramic circuit substrate and reducing the production cost.

In the formation of a thick-film resistor on a substrate surface, generally, a conductive substance is added to a glass composition, rendered pasty, printed and sintered into the desired resistor. In the formation of the resistor, occasionally, printing is effected so as to cover the resistor with a glass material and followed by firing to form an overcoat in order to protect the resistor and to improve the weather resistance thereof. The obtained resistor has its resistance value finely adjusted by laser trimming, etc.

One of the important properties of the thick-film resistor is high voltage pulse properties [ESD (electrostatic discharge) characteristics]. The conductance of the thick-film resistor relies on a thin glass layer formed between the conductive substances in glass. Application of a high voltage to the thick-film resistor destroys minute conductive paths, thereby causing resistance value changes. One possible method for improvement comprises refining the particle size of the glass powder to thereby improve the dispersion thereof in conductive particles with the result that the number of conductive paths formed out of the glass and conductive particles (e.g., $RuO_2$ particles in a $RuO_2$-based resistor) is increased to thereby decrease the amount of electric charges which flow through one conductive path, so that destruction of the conductive paths would be avoided and the resistance value changes minimized. However, with respect to the resistor co-fired with the glass overcoat, excess reduction of the particle size of the glass in the resistor tends to hamper the decomposition of a binder used in a paste, so that its decomposition cannot be completed before the sintering of the glass overcoat and hence the binder is confined by the glass overcoat to remain in the resistor as carbon, which is oxidized into $CO_2$, etc., and expands with the temperature rise to thereby form bubbles in the resistor.

Generally, a resistor used in a ceramic circuit substrate is formed by firing a resistor at 800 to 900° C., printing a low-melting point glass overcoat thereon, and firing at 500 to 600° C. In accordance with the miniaturization of electronic appliances and the higher-density packaging therein, there is the tendency that the ceramic substrate is also provided in multilayer form to comply with higher-density packaging and that use is made of substrate materials which each have a low coefficient of thermal expansion for mounting silicon chips thereon. As such circuit substrates, low-temperature firable substrates are used, Most of the low-temperature firable substrates contain Ag and Cu in the inner layers, so that, for decreasing the frequency of thermal expansion and shrinkage thereof to thereby give a circuit substrate of high reliability, the number of firing steps should be minimized. Further, for conformity with the thermal expansion of the circuit substrate, a glass composition (including, besides a glass powder, an additive powder, such as alumina powder) of a low coefficient of thermal expansion should be used in the glass overcoat as well, However, the low-melting point glass has a drawback in weather resistance, so that it is required to use a glass having a melting point as high as about the temperature employed for firing the resistor.

It is therefore apparent that a resistor capable of being co-fired with the glass overcoat is desirably employed in a ceramic circuit substrate of a low thermal expansion coefficient having a multilayer structure. However, the co-firing of the resistor and the glass overcoat brings about the tendency that the glass overcoat confines the bubbles generated from the resistor, thereby causing the bubbles to remain within the sintered resistor. When the bubbles remain as confined in the resistor, a problem occurs such that a very close access of a trimming edge to the bubble at the process of laser trimming produces cracks therebetween, resulting in the formation of a resistor lacking in stability in resistance values.

The above situation will be described with reference to the drawings. FIG. 1 is a plan view of one form of a conventional external resistor disposed on a ceramic circuit substrate, and FIG. 2 is a sectional view thereof. A wiring material, such as a metal paste, is printed on a ceramic substrate surface 1, thereby forming a conductor pattern 2 on the surface. Part thereof constitutes electrodes for a resistor 3. The resistor 3 is composed of glass components having a conductive material such as a metal added thereto. The upper part thereof is covered with an overcoat 4 composed of glass materials which may include an alumina powder or the like in addition to a glass powder. The resistor 3 and the overcoat 4 constitute an external resistor 7. The overcoat 4 may either cover each individual resistor 3 a little wider than the same or uniformly cover a wide area of not only a plurality of resistors 3 but also a conductor pattern 2. When the overcoat covers such a wide area, via holes can be provided at suitable positions to thereby attain continuity with the outside.

The co-firing of the overcoat 4 and the resistor 3 prevents the bubbles 6 generated in the resistor from escaping outside because of the presence of the overcoat 4, thus causing them to remain confined in the resistor 3. Laser trimming of such an external resistor 7 leads to the formation of a trimming channel 5 in the overcoat 4 and the resistor 3, as shown in the figures.

Although laser trimming is generally conducted while measuring the resistance value exhibited by the resistor, the presence of the bubbles 6 not only interferes with such precision trimming but also generates microcracks upon access of the trimming channel tip to the bubbles 6. Also, even if there is no occurrence of cracks during trimming, cracks may occur because of the bubbles during its use as a product. Thus, the presence of bubbles in the resistor renders the resistance value exhibited by the resistor inaccurate and renders its resistance value after adjustment unstable.

SUMMARY OF THE INVENTION

An object of the present invention is to provide a thick-film paste used for the formation of a ceramic circuit substrate having on its surface a resistor essentially free from bubbles and an overcoat co-fired with the resistor. A further object of the present invention is to provide a ceramic circuit substrate using such a paste.

The inventors have made intensive studies to find out that the above objects can be attained when a specific relationship is established between the resistor and the glass overcoat. The present invention has been arrived at on the basis of the above finding.

Accordingly, the present invention provides a ceramic circuit substrate using the following resistor paste and glass overcoat paste in combination.

(1) A resistor paste used for preparing a ceramic circuit substrate having a glass overcoat and a resistor co-fired thereon, the resistor paste forming the resistor and consisting essentially of $RuO_2$ powder, a glass powder and a vehicle comprising an organic polymer and a solvent, the $RuO_2$ powder and the glass powder having specific surface areas of 10 to 20 $m^2$/g and 4 to 14 $m^2$/g, respectively.

(2) A glass overcoat paste used for preparing a ceramic circuit substrate having a glass overcoat and a resistor co-fired thereon, the glass overcoat paste forming the overcoat and consisting essentially of a glass composition and a vehicle comprising an organic polymer and a solvent, the glass composition having a specific surface area of 2 to 6 $m^2$/g.

(3) A resistor paste as recited in item (1), above wherein the glass powder of the resistor paste is a $CaO$—$Al_2O_3$—$SiO_2$—$B_2O_3$ system glass and the weight ratio of the glass to the $RuO_2$ powder is 55:45 to 85:15.

(4) A glass overcoat paste as recited in item (2), wherein the glass composition of the glass overcoat paste consists essentially of 60 to 90% by weight of a $CaO$—$Al_2O_3$—$SiO_2$—$B_2O_3$ system glass powder and 10 to 40% by weight of alumina powder.

(5) A ceramic circuit element comprising a ceramic substrate having a glass overcoat and a resistor co-fired thereon, wherein the resistor and the glass overcoat are formed from the foregoing resistor paste and the glass overcoat paste and the ceramic circuit substrate comprises a $CaO$—$Al_2O_3$—$SiO_2$—$B_2O_3$ system or $MgO$—$Al2O3$—$SiO_2$—$B_2O_3$ system glass and alumina.

In the present specification, the term "glass composition" used for the glass overcoat is intended to mean a composition comprising a glass powder and an alumina powder, unless otherwise specified.

DETAILED DESCRIPTION OF THE PREFERRED EMBODIMENT

Figure 1:
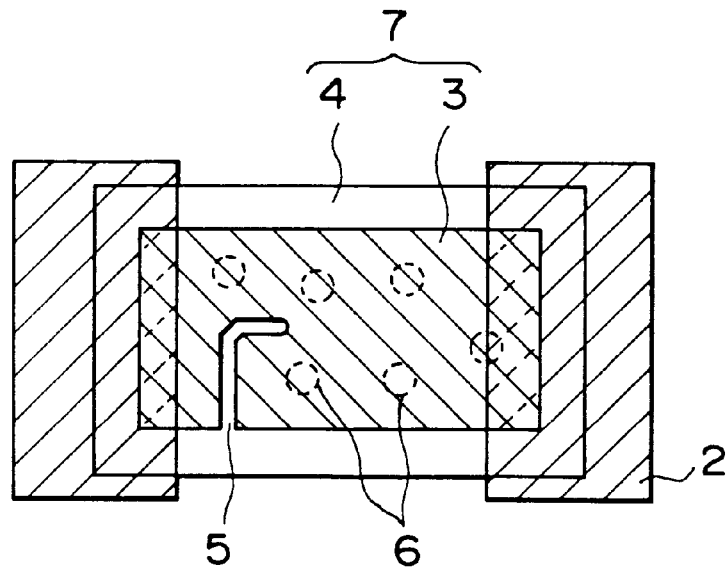
FIG. 1 is a view illustrating a conventional external resistor.
Figure 2:
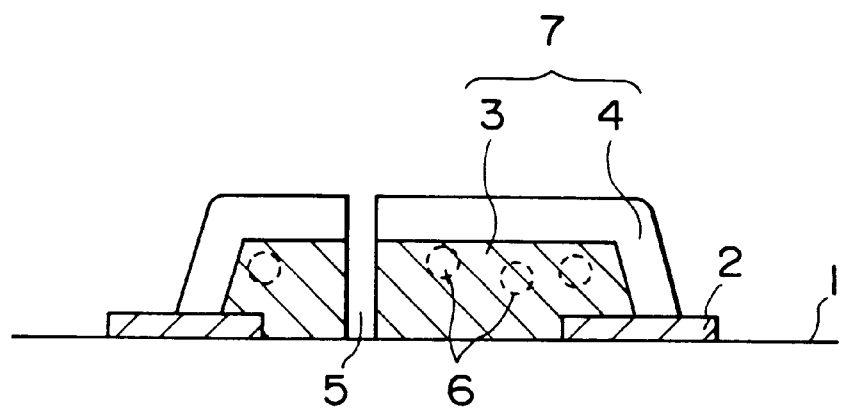
FIG. 2 is a sectional view of the resistor of FIG. 1.

Even if a co-firing of a glass overcoat and a resistor is carried out, the present invention enables the formation of a low-bubbling resistor having excellent ESD characteristics and no remaining bubbles. This is because the specific surface area (BET value) of the glass powder and $RuO_2$ powder of the resistor or the specific surface area of the glass composition of the overcoat have been limited to ranges ensuring easy escape of the bubbles from the resistor.

Specifically, the specific surface area (BET value) of the glass powder of the resistor must be within the range of 4 to 14 $m^2$/g. When the BET value of the glass powder of the resistor is less than 4 $m^2$/g, the ESD characteristics deteriorate. On the other hand, when the BET value exceeds 14 $m^2$/g, bubbles form in the resistor, thereby rendering its stability after laser trimming poor. Likewise, the BET value of the $RuO_2$ powder of the resistor must be within the range of 10 to 20 $m^2$/g. When the BET value of the $RuO_2$ powder of the resistor is less than 10 $m^2$/g, the ESD characteristics deteriorate. On the other hand, when the BET value exceeds 20 $m^2$/g, bubbles form in the resistor. Moreover, the BET value of the glass composition of the glass overcoat ranges from 2 to 6 $m^2$/g. when the BET value of this glass composition is less than 2 $m^2$/g, the denseness of the glass overcoat is lost and its moisture resistance is lowered. on the other hand, when the BET value exceeds 6 $m^2$/g, the glass overcoat becomes dense so rapidly that bubbles form in the resistor.

The ceramic circuit substrate of the present invention may have any of the monolayer and multilayer constructions as long as a ceramic is used as an insulator. A multilayer ceramic circuit substrate can be produced by, for example, a green sheet lamination process or a green sheet and printing multilayer process. A circuit may be provided only on one side of the substrate or both sides thereof.

The ceramic material used in the present invention is not particularly limited, examples thereof including alumina ($Al_2O_3$), aluminum nitride (AlN), silicon carbide (SiC) and various ceramics composed mainly thereof. A low-temperature firable ceramic can be used which is a mixture of alumina powder with glass powder. The conductor material for use as the inner layer is varied depending on the substrate material. When the substrate material is alumina or aluminum nitride, use is made of a high-melting point metal such as molybdenum or tungsten. When the substrate material can be fired at relatively low temperatures, use is made of a metal such as gold, silver, silver-palladium alloy, copper or nickel.

A ceramic circuit substrate in which W or Mo is used as a wiring conductor on a substrate of alumina or aluminum nitride or the like and of which the co-firing is conducted in a reducing atmosphere for preventing the oxidation of the conductor is known as an example of the co-fired ceramic circuit substrates produced by co-firing ceramic green sheets and a wiring conductor paste. However, this encounters the problem that conductor oxidation cannot be avoided in the formation of an $RuO_2$ system or $Bi_2Ru_2O_7$ system resistor of high reliability which must be fired in the air. On the other hand, a low-temperature firable multilayer ceramic circuit substrate in which use is made of an Ag-based conductor which has a low conductor resistance and can be fired in the air, such as Ag, Ag-Pd, Ag-Pt or Ag-Pd-Pt, and in which a ceramic material capable of being fired at temperatures not higher than the melting point of the above conductor material (900 to 1200° C.) is used as an insulator has been developed, which is especially preferred as the ceramic circuit substrate of the present invention.

Generally, a ceramic substrate which is fired at about 1200° C. or below is called "a low-temperature firable ceramic substrate", in which, for example, an Ag-based or Cu-based conductor is used as conductors on inner and surface layers. A material which can be fired at temperatures lower than the melting point of, for example, the inner Ag conductive material is preferably employed as the insulator material for use in the low-temperature firable ceramic substrate. When use is made of an Ag conductor or an Ag alloy conductor in which the contents of Pd and Pt are low, because the melting point of such a metal formed in multiple layers is as low as about 900 to 1200° C, it is necessary to employ a material which can be fired at 800 to 1100° C. Representative examples of such materials include those based on a mixture of the powder of a glass such as a borosilicate glass or a glass further containing some oxides (e.g., MgO, CaO, $Al_2O_3$, PbO, K2O, $Na_2O$, ZnO, $Li_2O$, etc.) with the powder of a ceramic such as alumina or quartz and those based on crystallizable glass powder which undergo cordierite or a-spodumene crystallization. More specific examples include a combination of a CaO—$Al_2O_3$—$SiO_2$—$B_2O_3$ system with alumina and a combination of a MgO—$Al_2O_3$—$SiO_2$—$B_2O_3$ system glass and alumina.

The above material can be used not only in the monolayer form mentioned above but also in the multilayer form. The multilayer substrate can be produced according to the green sheet lamination process in which a plurality of green sheets are employed. For example, a powdery ceramic insulating material is molded according to the doctor blade method into green sheets of about 0.1 to 0.5 mm in thickness. A paste of a conductor material such as Ag, Ag-Pd, Ag-Pt or Ag-Pd-Pt is screen printed on one of the green sheets to thereby give a desired wiring pattern. Through holes of about 0.1 to 2.0 mm in diameter are formed in the green sheet by means of blanking dies or a punching machine so as to enable connection to another conductor layer. Also, via holes for wiring are formed and filled with an Ag conductor material. In the same manner, wiring patterns are printed on other green sheets as many as required for forming the desired circuit. These green sheets are accurately laminated one upon another with the use of alignment holes respectively formed in the green sheets and unified by thermocompression bonding effected at 80 to 150° C. under 10 to 250 kg/cm$^2$.

When the circuit includes an inner resistor, an $RuO_2$ system or $Bi_2Ru_2O_7$ system resistor is formed which is fired in the air. In that case, it is printed together with terminals therefor on the green sheet for forming an inner layer.

The obtained structure is simultaneously fired in the air, thereby providing a ceramic multilayer substrate having conductors therein.

The present invention has been described with the low-temperature firable ceramic as an example. Although it is a preferred embodiment of the present invention, the present invention is not limited thereto.

A resistor for use in the present invention comprises a $RuO_2$-based or $Bi_2Ru_2O_7$-based electrically conductive component and glass. These are generally printed in the form of a paste on a ceramic circuit substrate according to the thick-film process. Onto the printed resistor, a glass overcoat component, for example, a glass overcoat paste comprising a CaO—$Al_2O_3$—$SiO_2$—$B_2O_3$ system glass powder and an alumina powder is usually printed by the thick film process. In the present invention, the resistor and glass overcoat are co-fired. The firing is conducted in an ordinary air.

The present invention will now be described in greater detail with reference to the following Examples and Comparative Examples.

EXAMPLE 1

A ceramic circuit substrate was prepared with the use of a low-temperature firable ceramic prepared according to the following procedure. 60% by weight of glass powder composed of, on a weight basis, 27% of CaO, 5% of $Al_2O_3$, 59% of $SiO_2$ and 9% of $B_2O_3$ was mixed with 40% by weight of $Al_2O_3$ powder having an average particle size of 1.0 μm to prepare a powder component.

The above powder component was mixed with, on a weight basis, 10% of acrylic resin, 30% of toluene, 10% of isopropyl alcohol and 5% of dibutyl phthalate in a ball mill to provide a slurry. The respective percentages are shown based on the weight of the powder component. The slurry was formed into a green sheet of 0.4 mm in thickness according to the doctor blade process. This green sheet was perforated at given positions by means of dies and an Ag paste was screen printed to fill the holes therewith. The sheet was dried, and further, the Ag paste was screen printed on the sheet to thereby form a wiring pattern. In the same manner, other green sheets having printed wiring patterns were prepared. A given number of obtained sheets were laminated one upon another and caused to undergo thermocompression bonding. The resultant laminate was fired by holding it at 900° C. for 20 min. Thus, a ceramic circuit substrate was obtained.

Each resistor paste was prepared with the use of each of the glass compositions A to C specified in Table 1 and $RuO_2$ in the mixing ratio shown in Table 3 and printed on the ceramic substrate so as to form a resistor of 1 mm in width and 2 mm in length. The glass powder used in the resistor paste had an average particle size of less than 2 μm. In the preparation of the resistor paste, use was made of an organic vehicle comprising ethyl cellulose and terpineol.

A glass overcoat was formed by printing on the resultant resistor an overcoat paste prepared from each of the glass compositions D to F specified in Table 2 and an organic vehicle comprising ethyl cellulose and terpineol. Glass compositions were made by mixing a CaO—$Al_2O_3$—$SiO_2$—$Cr_2O_3$—$B_2O_3$ system glass powder and an alumina powder at the respective mixing ratios by weight shown in Table 2 so as to provide chemical compositions D to F. Although in the glass compositions, $Cr_2O_3$ was included for the purpose of coloration of the resultant glass overcoats, it may be excluded.

TABLE 1

Chemical Composition of Glass of Resistor (wt. %)

|   | CaO  | $Al_2O_3$ | $SiO_2$ | $B_2O_3$ | impurities |
|---|------|-----------|---------|----------|------------|
| A | 20.2 | 12.6      | 36.7    | 27.0     | 3.5        |
| B | 26.2 | 3.1       | 36.2    | 32.9     | 1.6        |
| C | 17.3 | 7.0       | 53.9    | 18.2     | 3.6        |

TABLE 2

Glass Compositions of Glass Overcoat (wt. %)

|   | CaO  | $Al_2O_3$ | $SiO_2$ | $B_2O_3$ | $Cr_2O_3$ | impurities | glass powder:$Al_2O_3$ powder |
|---|------|-----------|---------|----------|-----------|------------|-------------------------------|
| D | 16.0 | 35.3      | 36.1    | 10.7     | 0.9       | 1.0        | 70:30                         |
| E | 14.0 | 37.8      | 39.2    | 7.2      | 0.3       | 1.5        | 67:33                         |
| F | 18.2 | 32.1      | 32.0    | 14.1     | 1.8       | 1.8        | 73:27                         |

With respect to each of the various combinations of resistors and glass overcoats, a co-firing was performed in air at 890° C. for 10 min.

The results are given in Table 3. In the table, ESD means the percentage of change of resistance value observed at the application of 10 pulses of a voltage of 1 kV. The moisture resistance load means the maximum of the percentages of change of resistance value observed at the 1000-hr continuous application of 1/32 W load at 85° C. and at 85% RH after laser trimming. The heat cycle means the percentage of change of resistivity observed after repeating heating in the temperature range of from −55 to 125° C., 100 times after laser trimming.

TABLE 3

Test Example and Test Results

| | Resistor | | | | Glass overcoat | | Test results | | |
|---|---|---|---|---|---|---|---|---|---|
| | chemical composition of glass | BET value of glass (m²/g) | BET value of RuO₂ (m²/g) | glass: RuO₂ | glass composition | BET value of glass composition (m²/g) | ESD (%) | moisture resistance load (%) | heat cycle after trimming (%) |
| 1 | A | 8.0 | 15.0 | 80:20 | D | 4.0 | −0.1 | +0.1 | +0.2 |
| 2 | A | 13.9 | 19.7 | 80:20 | D | 5.9 | −0.1 | +0.1 | +0.4 |
| 3 | A | 13.9 | 19.7 | 80:20 | D | 2.1 | −0.1 | +0.5 | +0.4 |
| 4 | A | 4.2 | 10.2 | 80:20 | D | 5.9 | −0.5 | +0.1 | +0.1 |
| 5 | A | 4.2 | 10.2 | 80:20 | D | 2.1 | −0.5 | +0.5 | +0.1 |
| 6 | A | 13.9 | 19.7 | 70:30 | D | 5.9 | −0.1 | +0.1 | +0.2 |
| 7 | A | 13.9 | 19.7 | 55:45 | D | 5.9 | −0.1 | +0.3 | +0.1 |
| 8 | A | 13.9 | 19.7 | 85:15 | D | 5.9 | −0.6 | +0.2 | +0.3 |
| 9 | B | 7.9 | 15.0 | 80:20 | D | 4.0 | −0.1 | +0.1 | +0.1 |
| 10 | B | 13.8 | 19.7 | 80:20 | D | 5.9 | −0.1 | +0.1 | +0.6 |
| 11 | B | 13.8 | 19.7 | 80:20 | D | 2.1 | −0.1 | +0.5 | +0.5 |
| 12 | B | 4.0 | 10.2 | 80:20 | D | 5.9 | −0.6 | +0.1 | +0.2 |
| 13 | B | 4.0 | 10.2 | 80:20 | D | 2.1 | −0.6 | +0.6 | +0.2 |
| 14 | B | 7.9 | 15.0 | 70:30 | D | 4.0 | −0.2 | +0.1 | +0.3 |
| 15 | B | 7.9 | 15.0 | 55:45 | D | 4.0 | −0.1 | +0.2 | +0.3 |
| 16 | B | 7.9 | 15.0 | 85:15 | D | 4.0 | −0.4 | +0.2 | +0.2 |
| 17 | C | 7.7 | 15.0 | 80:20 | D | 4.0 | −0.2 | +0.1 | +0.2 |
| 18 | C | 14.0 | 19.7 | 80:20 | D | 5.9 | −0.1 | +0.1 | +0.6 |
| 19 | C | 14.0 | 19.7 | 80:20 | D | 2.1 | −0.1 | +0.6 | +0.5 |
| 20 | C | 4.1 | 10.2 | 80:20 | D | 5.9 | −0.5 | +0.1 | +0.2 |
| 21 | C | 4.1 | 10.2 | 80:20 | D | 2.1 | −0.5 | +0.4 | +0.2 |
| 22 | C | 14.0 | 19.7 | 70:30 | D | 5.9 | −0.1 | +0.1 | +0.2 |
| 23 | C | 14.0 | 19.7 | 55:45 | D | 5.9 | −0.1 | +0.2 | +0.3 |
| 24 | C | 14.0 | 19.7 | 85:15 | D | 5.9 | −0.2 | +0.1 | +0.3 |
| 25 | C | 14.0 | 19.7 | 80:20 | E | 2.2 | −0.1 | +0.5 | +0.7 |
| 26 | C | 14.0 | 19.7 | 80:20 | E | 5.9 | −0.1 | +0.1 | +0.8 |
| 27 | C | 4.1 | 10.2 | 80:20 | E | 2.2 | −0.5 | +0.4 | +0.2 |
| 28 | C | 4.1 | 10.2 | 80:20 | E | 5.9 | −0.5 | +0.1 | +0.2 |
| 29 | C | 14.0 | 19.7 | 70:30 | E | 2.2 | −0.1 | +0.2 | +0.2 |
| 30 | C | 14.0 | 19.7 | 55:45 | E | 2.2 | −0.1 | +0.4 | +0.4 |
| 31 | C | 14.0 | 19.7 | 85:15 | E | 2.2 | −0.2 | +0.4 | +0.3 |
| 32 | C | 14.0 | 19.7 | 80:20 | F | 2.3 | −0.1 | +0.5 | +0.8 |
| 33 | C | 14.0 | 19.7 | 80:20 | F | 5.8 | −0.1 | +0.1 | +0.8 |
| 34 | C | 4.1 | 10.2 | 80:20 | F | 2.3 | −0.5 | +0.5 | +0.2 |
| 35 | C | 4.1 | 10.2 | 80:20 | F | 5.8 | −0.5 | +0.1 | +0.2 |
| 36 | C | 4.1 | 10.2 | 70:30 | F | 2.3 | −0.3 | +0.3 | +0.3 |
| 37 | C | 4.1 | 10.2 | 55:45 | F | 2.3 | −0.1 | +0.5 | +0.6 |
| 38 | C | 4.1 | 10.2 | 85:15 | F | 2.3 | −0.6 | +0.4 | +0.3 |
| 39 | A | 15.1 | 19.7 | 80:20 | D | 4.0 | −0.1 | +0.1 | +2.1 |
| 40 | A | 3.2 | 15.0 | 80:20 | D | 4.0 | −1.7 | +0.1 | +0.2 |
| 41 | A | 8.0 | 7.2 | 80:20 | D | 4.0 | −2.3 | +0.1 | +0.1 |
| 42 | A | 8.0 | 25.6 | 80:20 | D | 4.0 | −0.1 | +0.1 | +2.5 |
| 43 | B | 7.9 | 15.0 | 80:20 | E | 1.3 | −0.1 | +1.7 | +0.1 |
| 44 | B | 7.9 | 15.0 | 80:20 | E | 8.6 | −0.1 | +0.1 | +1.9 |
| 45 | C | 7.7 | 15.0 | 80:20 | F | 1.2 | −0.1 | +1.8 | +0.1 |
| 46 | C | 7.7 | 15.0 | 80:20 | F | 8.5 | −0.1 | +0.1 | +1.7 |

In Table 3, the test results of combinations of resistors using glasses A to C with glass overcoats using the glass compositions D to F are given in terms of the maximum of the percentages of change of resistance value. In the table, Nos. 1 to 38 relate to working examples of the present invention while Nos. 39 to 46 relate to comparative examples. It is apparent from Table 3 that, when use is made of powders whose BET values fall within the scope of the present invention, the resistance change percentage is smaller than in any of the other comparative test results.

As apparent from the foregoing, the present invention provides a ceramic circuit substrate having a resistor containing few bubbles and an overcoat co-fired therewith, and realizes the exertion of resistance performance which ensures excellent weather resistance and stability because the resistor after trimming is sufficiently protected.

What is claimed is:

1. A resistor paste used for preparing a ceramic circuit substrate having a glass overcoat and a resistor co-fired thereon, said resistor paste forming said resistor and consisting essentially of $RuO_2$ powder, glass powder and a vehicle comprising an organic polymer and a solvent, the $RuO_2$ powder and the glass powder having specific surface areas of 10 to 20 m²/g and 4 to 14 m²/g, respectively.

2. A glass overcoat paste used for preparing a ceramic circuit substrate having a glass overcoat and a resistor co-fired thereon, said glass overcoat paste forming said overcoat and consisting essentially of a glass composition and a vehicle comprising an organic polymer and a solvent, the glass composition having a specific surface area of 2 to 6 m²/g.

3. A resistor paste according to claim 1, wherein said glass powder of the resistor paste is a $CaO$—$Al_2O_3$—$SiO_2$—$B_2O_3$ system glass and the weight ratio of the glass to the $RuO_2$ powder is 55:45 to 85:15.

4. A glass overcoat paste according to claim 2, wherein said glass composition of the glass overcoat paste consists essentially of 60 to 90% by weight of a $CaO$—$Al_2O_3$—$SiO_2$—$B_2O_3$ system glass powder and 10 to 40% by weight of alumina powder.

5. A ceramic circuit element comprising a ceramic substrate having a glass overcoat and a resistor co-fired thereon, said class overcoat being provided over said resistor and said resistor being formed from a resistor paste consisting essentially of $RuO_2$ powder, glass powder and a vehicle comprising an organic polymer and a solvent, the $RuO_2$ powder and the glass powder having specific surface areas of 10 to 20 $m^2/g$ and 4 to 14 $m^2/g$, respectively, said glass overcoat being formed from a glass overcoat paste consisting essentially of a glass composition and a vehicle comprising an organic polymer and a solvent, the glass composition having a specific surface area of 2 to 6 $m^2/g$ and said ceramic circuit substrate comprising a $CaO$—$Al_2O_3$—$SiO_2$—$B_2O_3$ system or $MgO$—$Al_2O_3$—$SiO_2$—$B_2O_3$ system glass, and alumina.

6. A ceramic circuit element according to claim 5, wherein said glass powder of the resistor paste is a $CaO$—$Al_2O_3$—$SiO_2$—$B_2O_3$ system glass and the weight ratio of the glass to the $RuO_2$ powder is 55:45 to 85:15.

7. A ceramic circuit element according to claim 5, wherein said glass composition of the glass overcoat paste consists essentially of 60 to 90% by weight of a $CaO$—$Al_2O_3$—$SiO_2$—$B_2O_3$ system glass powder and 10 to 40% by weight of alumina powder.

8. A resistor paste according to claim 1, wherein the glass powder has a particle size of less than 2 microns.

9. A ceramic circuit element according to claim 5, wherein the glass powder of the resistor has an average particle size of less than 2 microns.

* * * * *

UNITED STATES PATENT AND TRADEMARK OFFICE
CERTIFICATE OF CORRECTION

PATENT NO : 6 037 045
DATED : March 14, 2000
INVENTOR : Masashi FUKAYA

It is certified that error appears in the above-identified patent and that said Letters Patent are hereby corrected as shown below:

On the title page, please insert Foreign Application Priority Data as follows:

March 9, 1995    [JP]   Japan .............. 7-49734

Column 9, line 10; change "said class overcoat" to ---said glass overcoat---.

Signed and Sealed this

Tenth Day of April, 2001

Attest:

NICHOLAS P. GODICI

*Attesting Officer*     Acting Director of the United States Patent and Trademark Office